United States Patent [19]
Wilcox

[11] Patent Number: 6,107,855
[45] Date of Patent: Aug. 22, 2000

[54] REDUNDANT CLOCK SIGNAL GENERATING CIRCUITRY

[75] Inventor: Jeffrey Wilcox, Westford, Mass.

[73] Assignee: EMC Corporation, Hopkinton, Mass.

[21] Appl. No.: 09/156,747

[22] Filed: Sep. 17, 1998

Related U.S. Application Data

[63] Continuation of application No. 08/670,858, Jun. 28, 1996, Pat. No. 5,886,557.

[51] Int. Cl.[7] ........................................ G06F 1/04
[52] U.S. Cl. ........................... 327/295; 713/400; 713/600
[58] Field of Search .................... 327/291–298; 326/93, 96; 713/400, 401, 600

[56] References Cited

U.S. PATENT DOCUMENTS

| | | | |
|---|---|---|---|
| 4,185,245 | 1/1980 | Fellinger et al. | 327/292 |
| 5,065,454 | 11/1991 | Binz ert al. | 327/292 |
| 5,377,206 | 12/1994 | Smith | 327/292 |
| 5,422,915 | 6/1995 | Byers et al. | 327/292 |
| 5,475,324 | 12/1995 | Tomiyori | 327/292 |
| 5,642,069 | 6/1997 | Waite | 327/292 |
| 5,886,557 | 3/1999 | Wilcox | 327/292 |

*Primary Examiner*—Kenneth B. Wells
*Attorney, Agent, or Firm*—David N. Caracappa; John M. Gunther; Leanne J. Fitzgerald

[57] ABSTRACT

A clock distribution system in a reliable electronic system includes a predetermined number of clock signal load circuits, each having a clock signal input terminal. A first clock signal generator has the same predetermined number of clock signal output terminals coupled to the clock signal input terminals of the clock signal load circuits. A second clock signal generator also has the same predetermined number of clock signal output terminals which are also coupled to the clock signal input terminals of the clock signal load circuits.

1 Claim, 4 Drawing Sheets

REDUNDANT CLOCK SIGNAL GENERATING CIRCUITRY

This application is a Continuation of U.S. Ser. No. 08/670,858, filed on Jun. 28, 1996, now U.S. Pat. No. 5,886,557.

The present invention relates to a reliable system for distributing clock signals in an electronic system.

Electronic systems almost always require a clock signal to operate, and include a clock signal generator in their design. Electronic systems in important applications, such as telephone transmission systems, or computer systems implementing important applications, termed reliable applications, often have redundant components so that they can continue to operate, even if one (or possibly more than one) component should fail. Redundant clock signal generators and clock signal distribution systems are included in such reliable electronic systems.

In one known reliable clock signal distribution system, a pair of clock signal generators and a clock signal monitor, is provided in the design. In some designs, one clock signal generator is designated the master, and the other clock signal generator is designated the slave. The master clock signal generator provides its clock signal to the electronic system. If the master clock signal generator fails, as detected by the clock signal monitor, then the master clock signal generator is disabled, and the slave clock signal generator takes over. In some such systems, no attempt is made to minimize phase discontinuities when a switch is made from the master clock signal generator to the slave clock signal generator. In other such systems, synchronism is not maintained between the signal from the master clock signal generator and the signal from the slave clock signal generator, but when a switchover is to occur the phases of the master and slave clock signal generators are monitored, and when they are approximately equal, the switchover is made. In yet other such systems, the signal from the slave clock signal generator is maintained in phase synchronism with the signal from the master clock signal generator so that there is no phase discontinuity in the event of a switchover of clock signal generators.

Other reliable clock signal distribution system designs provide several clock signal generators. The clock signal provided to the system is selected from among them. In some systems, the clock signal generators are assigned different priorities, and the operative clock signal generator having the highest priority supplies its clock signal to the system. In the event of this clock signal generator becoming inoperative, the operative clock signal generator with the next highest priority supplies its signal to the electronic system, and so forth. In other systems, the clock signal supplied to the system is one selected from among all the clock signal generators decided on by a majority vote, in a known manner. In yet other systems, the signal supplied to the electronic system is derived from the clock signals from all the operative clock signal generators.

There are several characteristics which are desirable in a reliable clock signal distribution system. First, respective clock signal generators should be provided on different assemblies. In this manner, if one clock signal generator fails, it may be removed and repaired or replaced while the other clock signal generator provides a clock signal for the electronic system. Thus, the electronic system continues to operate without disruption while the failed clock signal generator is repaired.

Second, on power-up, there should be an automatic indication of which clock signal generator is to initially supply its clock signal to the electronic system—i.e. which is the master or highest priority clock signal generator. Third, the operation of each clock signal generator is monitored by circuitry residing in another clock signal generator. This provides some assurance of accurate detection of the failure of a clock signal generator. Fourth, switchover from a failed clock signal generator to another clock signal generator should be rapid after detection of the failure. Fifth, there should be some assurance that once a clock signal generator has been disabled due to failure, its clock signal drivers will not be re-enabled. Sixth, when a new clock signal generator is inserted into the system, its clock signal drivers must be automatically disabled. This, and the provision of clock signal generators on separate assemblies, will allow for the removal and replacement of a failed clock signal generator without requiring that power be removed from the electronic system.

Seventh, the appearance of extended or shortened clock pulses in the event of a switchover from one clock signal generator to another should be prevented. This must be present regardless of the load on the clock signal lines. Eighth, clock signal skew among the different units coupled to receive the clock signal should be minimized. Finally, the implementation of the clock signal distribution system should be technology independent. That is, it should be able to be implemented in any of 5v TTL, 3v TTL, CMOS, ECL, or any other such technology.

In accordance with principles of the present invention, a clock distribution system in a reliable electronic system includes a predetermined number of clock signal load circuits, each having a clock signal input terminal. A first clock signal generator has the same predetermined number of clock signal output terminals coupled to the clock signal input terminals of the clock signal load circuits. A second clock signal generator also has the same predetermined number of clock signal output terminals which are also coupled to the clock signal input terminals of the clock signal load circuits.

Figure 1:
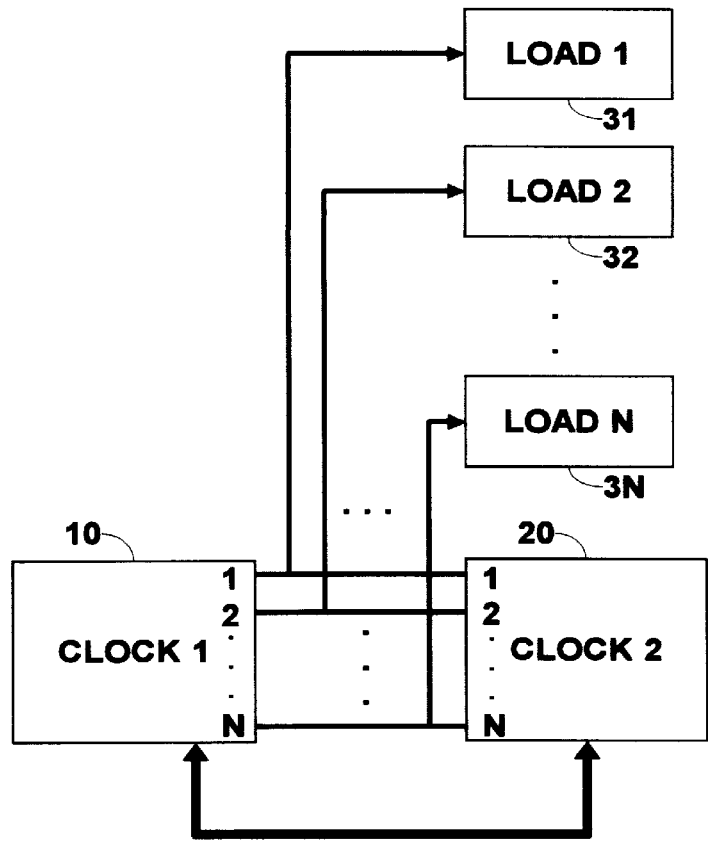
FIG. 1 is a block diagram of an electronic system including a clock distribution system according to the present invention.

FIG. 1 is a block diagram of an electronic system including a clock distribution system according to the present invention. In FIG. 1, single signals are represented by thin signal lines, and multiple signals are represented by thick signal lines. In FIG. 1, a first clock signal generator 10 (CLOCK 1) produces a plurality of N clock signals at respective clock signal output terminals 1 through N. Clock signal output terminal 1 is coupled to a clock signal input terminal of a first clock signal load circuit 31; clock signal output terminal 2 is coupled to a clock signal input terminal of a second clock signal load circuit 32; and clock signal output terminal N is coupled to a clock signal input terminal of an Nth clock signal load circuit 3N.

A second clock signal generator 20 (CLOCK 2) also produces a plurality of N clock signals at respective clock signal output terminals 1 through N. Referring now to the second clock signal generator 20, clock signal output terminal 1 is coupled to the clock signal output terminal 1 of the first clock signal generator 10, and to the clock signal input terminal of the first clock signal load circuit 31; clock signal output terminal 2 is coupled to the clock signal output terminal 2 of the first clock signal generator 10 and to the clock signal input terminal of the second clock signal load circuit 32, and clock signal output terminal N is coupled to the clock signal output terminal N of the first clock signal generator 10 and the clock signal input terminal of the $N^{th}$ clock signal load circuit 3N. A plurality of status and control signals (to be described in more detail below) are coupled between corresponding control terminals of the first clock signal generator 10 and the second clock signal generator 20.

It is preferred that the first and second clock signal generators 10 and 20 are provided on separate assemblies so that each may be independently removed from, and replaced in the electronic system. It is also preferred that the first and second clock signal generators 10 and 20 be physically located relatively close to each other and that the signal lines coupling their respective clock signal output terminals to the corresponding clock signal load circuits 31 through 3N are carefully matched in terms of length of connection, and impedance of the connecting line. For example, in one embodiment, the connection medium between the clock signal generators 10 and 20 and the clock signal load circuits 31 through 3N is a backplane printed circuit card with edge connectors for the clock signal generators 10 and 20 and the clock signal load circuits 31 through 3N.

In the preferred embodiment, described above, the first and second clock signal generators 10 and 20 are implemented on separate printed circuit cards, and are intended to be plugged into edge connectors next to each other on the backplane card. The clock signal load circuits 31 through 3N are also implemented on separate printed circuit cards, and are plugged into corresponding edge connectors arranged on the backplane card so that the signal traces connecting the clock signals from the clock signal generator edge connectors to the clock signal load circuit edge connectors are matched in terms of trace length and impedance.

In operation, one of the clock signal generators (10 or 20) is automatically selected (in a manner to be described in more detail below) to produce its clock signals and provide them to the respective clock signal load circuits 31 through 3N on power up. For example, the first clock signal generator 10 may be selected to provide its respective clock signals to the clock signal load circuits 31 through 3N on power up. The clock signal drivers in clock signal generator 10, therefore, are enabled, and the clock signals generated in the first clock signal generator 10 are provided to the respective clock signal load circuits 31 through 3N. Simultaneously, the clock signal drivers in the second clock signal generator 20 are disabled. For example they may be placed in a high-impedance mode, in a known manner.

The second clock signal generator 20 does monitor the clock signal generated by the first clock signal generator. If a malfunction is detected, the second clock signal generator 20 provides a control signal to the first clock signal generator conditioning it to disable its clock signal drivers. The second clock signal generator 20 simultaneously enables its clock signal drivers and provides the respective clock signals to the clock signal load circuits 31 through 3N.

Figure 2:
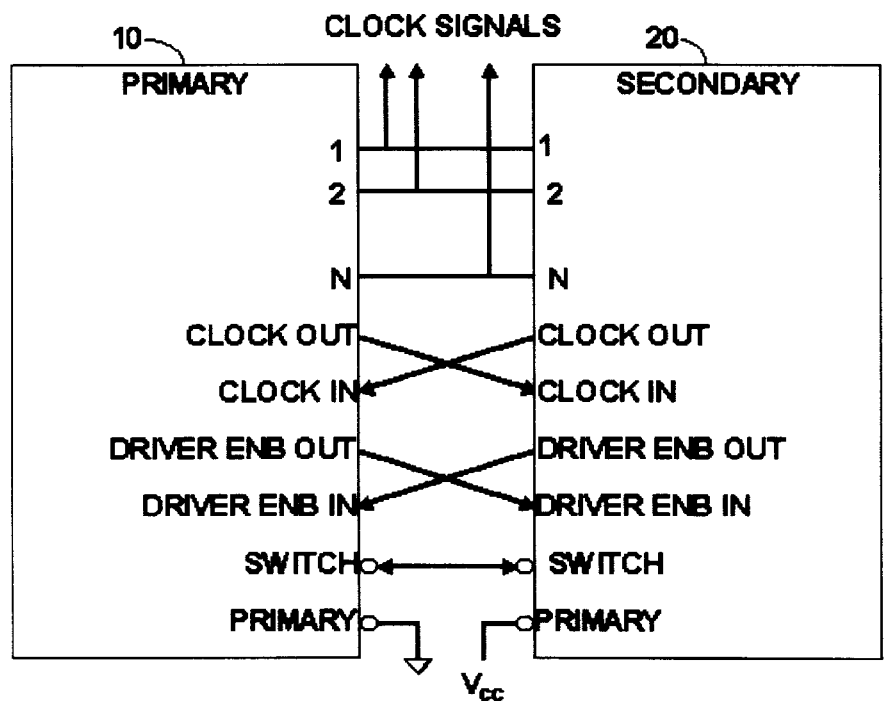
FIG. 2 is a more detailed block diagram illustrating the control signals coupled between the first and second clock signal generators illustrated in FIG. 1.

FIG. 2 is a more detailed block diagram illustrating the control signals coupled between the first and second clock signal generators 10 and 20, as illustrated in FIG. 1. Elements which are the same as illustrated in FIG. 1 are designated by the same reference numbers, and are not described in detail below. Each of the first and second clock signal generators 10 and 20 illustrated in FIG. 2 include respective clock signal output terminals 1 through N, coupled to the clock signal load circuits, as illustrated in FIG. 1. The first clock signal generator 10 has a reference clock output terminal coupled to a corresponding reference clock input terminal of the second clock signal generator 20; and a clock signal driver enable output terminal coupled to a corresponding clock signal driver enable input terminal of the second clock signal generator 20. Correspondingly, the second clock signal generator 20 has a reference clock output terminal coupled to a corresponding reference clock input terminal of the first clock signal generator 10; and a clock signal driver enable output terminal coupled to a corresponding clock signal driver enable input terminal of the first clock signal generator 10.

Corresponding bidirectional switch control terminals of the first and second clock signal generators 10 and 20 are coupled together. A primary control input terminal of the first clock signal generator 10 is coupled to a source of a reference potential (ground) and a primary control input terminal of the second clock signal generator 20 is coupled to a source of an operating potential $V_{CC}$.

As described above, each of the first and second clock signal generators 10 and 20 monitor the clock signal produced by the other. A reference clock signal is produced at the respective reference clock output terminals of the first and second clock signal generators 10 and 20, and are supplied to the reference clock input terminals of the other clock signal generator, to be monitored in a manner described in more detail below. In addition, each of the first and second clock signal generators 10 and 20 produces a signal at the clock signal driver enable output terminals indicating whether its clock signal output drivers are enabled. Each of the first and second clock signal generators 10 and 20 monitors the clock signal driver enable signal from the other clock signal generator in a manner described in more detail below. In the event that one of the first and second clock signal generators 10 and 20 detects a fault in the other, it generates a switch signal on its bidirectional switch signal terminal in a manner described in more detail below. Similarly, if a clock signal generator detects a switch signal at its switch terminal, it will disable its clock signal output drivers, as described in more detail below.

The signals supplied to the primary input terminals of each of the first and second clock signal generator 10 and 20 determine whether, on power up, that clock signal generator is conditioned to enable its clock signal output drivers, and operate as the primary clock signal source, or disable its clock signal drivers, and operate as the secondary clock signal source. In the illustrated embodiment, a logic '0' signal (ground) at the primary input terminal conditions the clock signal generator to which it is supplied to operate as the primary clock signal source, and a logic '1' signal ($V_{CC}$) at the primary input terminal conditions the clock signal generator to which it is supplied to operate as the secondary clock signal source.

Figure 3:
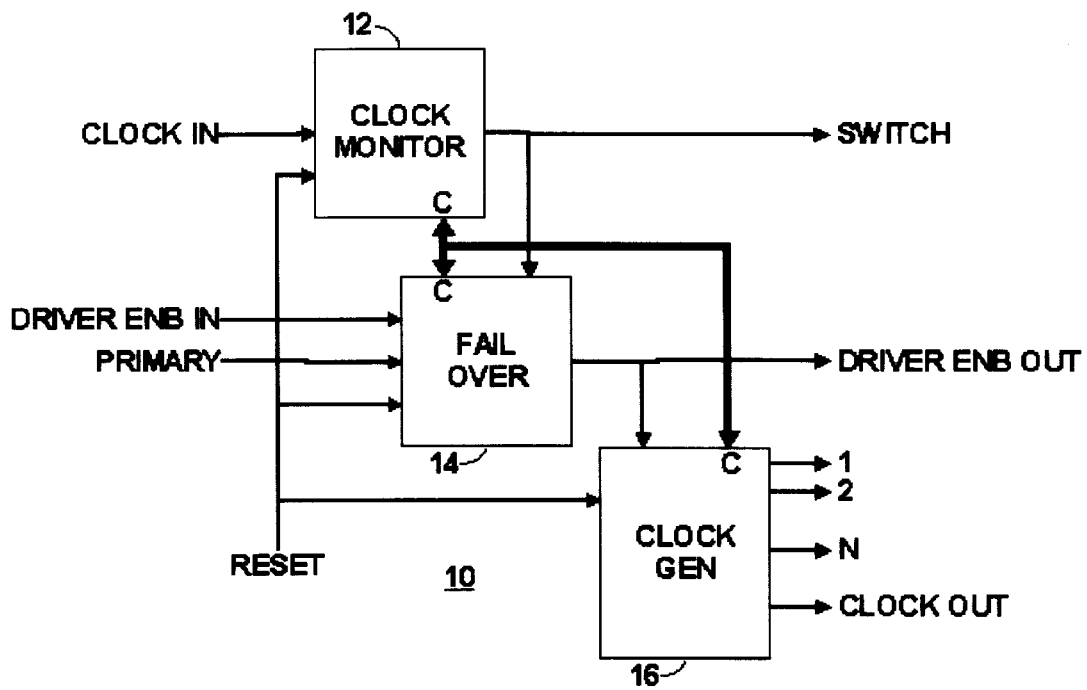
FIG. 3 is a more detailed block diagram of a clock signal generator according to the present invention as illustrated in FIG. 1.

FIG. 3 is a more detailed block diagram of a clock signal generator according to the present invention as illustrated in FIG. 1. In FIG. 3, the first clock signal generator 10 is illustrated, however, the second clock signal generator 20 is constructed identically. In FIG. 3, the reference clock input terminal is coupled to an clock signal input terminal of a clock signal monitor 12. An output terminal of the clock signal monitor 12 generates the switch signal, and is coupled to the switch signal terminal and to a corresponding input terminal of a fail over circuit 14. The clock signal driver enable input terminal and the primary input terminal are coupled to respective input terminals of the fail over circuit 14. An output terminal of the fail over circuit 14 generates the clock signal driver enable output signal, and is coupled to the driver enable output terminal and to a corresponding input terminal of the clock signal generating circuit 16.

The clock signal generating circuit 16 has a plurality of clock signal output terminals which are coupled to corresponding clock signal output terminals 1 through N. The clock signal generating circuit 16 also has a reference clock output terminal which produces a reference clock signal and is coupled to the reference clock output terminal. An internally located source of a reset signal, which may, for example, be a power-on reset signal, or a reset signal generated as a result of the clock signal generator 10 being inserted into the electronic system while it is powered, is coupled to corresponding input terminals of the clock signal monitor 12, the fail over circuit 14 and the clock signal generating circuit 16. In addition, respective bidirectional control signal terminals C of the clock monitor 12, the fail over circuit 14 and the clock generating circuit 16 are coupled together, and carry timing, control and status signals among the circuits to which they are coupled.

In operation, the reference clock input terminal receives a reference clock signal from the other clock signal generator (e.g. 20). The driver enable input terminal receives a signal indicating the state of the clock signal drivers of the other clock signal generator (e.g. 20). For example, the driver enable signal may be a digital signal in which a logic '0' signal indicates that the clock signal drivers of the other clock signal generator (e.g. 20) are inactive, or in the high impedance state, and a logic '1' signal indicates that they are active. The reset signal is a signal is a logic '0' signal for some predetermined time period after power has been initially applied to the clock signal generator 10, or the clock signal generator 10 has been initially inserted into the electronic system, and becomes a logic '1' signal afterward.

The clock signal monitor 12 monitors the reference clock signal from the other clock signal generator (e.g. 20), and if a malfunction is detected, generates a signal on the switch signal line, in a manner described in more detail below. The fail over circuit 14 monitors the driver enable input signal, the primary signal (described above), the reset signal and the switch signal, in a manner to be described in more detail below, to determine the state of the clock signal drivers of the clock signal generator 10. The clock signal generating circuit 16 produces the respective clock signals for the clock signal load circuits 31 through 3N (of FIG. 1) in a manner to be described in more detail below. The clock signal generating circuit 16 enables its clock signal drivers only when the driver enable output signal from the failover circuit 14 is active. The clock signal generator also produces the reference clock signal for the other clock signal generator (e.g. 20) to monitor. The clock signal generating circuit further produces timing control signals for synchronization of the remainder of the clock signal generator 10 at its bidirectional control signal terminal C. The clock signal monitor 12 and the fail over circuit 14 synchronize their operation in response to these control signals in a manner to be described in more detail below.

Figure 4:
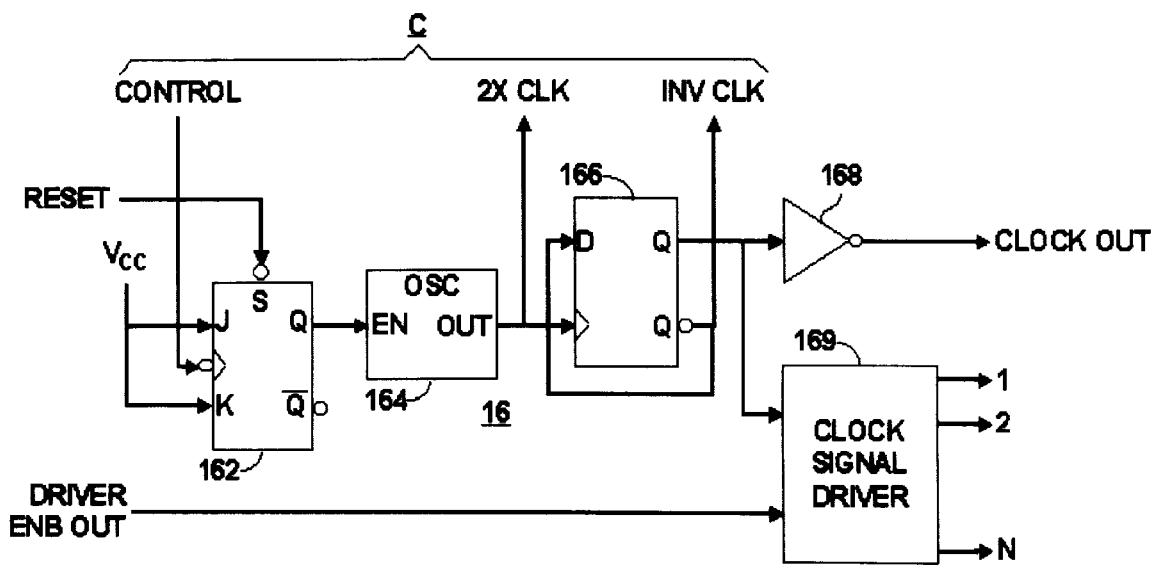
FIG. 4 is a more detailed block diagram of the clock signal generating circuit illustrated in FIG. 3.

FIG. 4 is a more detailed block diagram of the clock signal generating circuit 16 illustrated in FIG. 3. In FIG. 4, the reset signal is coupled to a preset input terminal S of a J-K flip-flop 162, a clock control signal, CONTROL, (received via the bidirectional control terminal C, and described in more detail below) from the fail over circuit 14 (of FIG. 3) is coupled to the clock signal input terminal of the J-K flip-flop 162, and a source of an operating potential $V_{CC}$, which is a logic '1' signal, is coupled to both the J and K input terminals of the J-K flip-flop 162. A Q output terminal of the flip-flop 162 is coupled to an enable input terminal of an oscillator 164.

A clock signal output terminal of the oscillator 164, producing a twice frequency clock signal (2X CLK), is coupled to a clock input terminal of a D flip-flop 166 and to the bidirectional control terminal C. An inverting Q output terminal of the D flip-flop 166, generating an inverted clock signal (INV CLK), is coupled to a D input terminal of the D flip-flop 166 and to the bidirectional control terminal C. A Q output terminal of the D flip-flop 166 is coupled to an input terminal of an inverter 168, and to a clock signal input terminal of a clock signal driver 169. An output terminal of the inverter 168 generates the reference clock signal for the other clock signal generator (e.g. 20) and is coupled to the reference clock output terminal. The clock signal driver enable output signal from the fail over circuit 14 is coupled to an enable signal input terminal of the clock signal driver 169. Respective output terminals of the clock signal driver 169 are coupled to clock signal input terminals of corresponding clock signal load circuits 31 through 3N via output terminals 1, 2 through N, as illustrated in FIG. 1.

In operation, the oscillator 164 generates a clock output signal at twice the frequency of the reference clock signal as long as the signal at its enable input terminal is a logic '1' signal. In a preferred embodiment, the output signal from the oscillator 164 is terminated in such a manner that it assumes a valid logic signal level (i.e. either a logic '0' signal or a logic '1' signal) when the oscillator is disabled. Specifically, either a parallel or AC termination method is preferred. Upon initial power application to the clock signal generator 10, or upon insertion of a replacement clock signal generator 10 in the electronic system, the reset signal becomes a logic '0' signal for some predetermined period of time, and then becomes a logic '1' signal, as described above.

A logic '0' signal at the preset input terminal of the J-K flip-flop 162 conditions the flip-flop 162 to produce a logic '1' signal at its Q output terminal, thus enabling the oscillator 164 to produce the clock signal 2X CLK. The clock signal from the oscillator, 2X CLK, is divided in frequency by the D flip-flop 166 to produce the clock signal from which all others are derived. The clock signal from the Q output terminal of the D flip-flop 166 drives the clock signal driver 169, which is a low skew clock signal driver of a known design. In a preferred embodiment, the clock signal driver 169 provides one signal output terminal for each of the clock signal loads 31 through 3N (of FIG. 1). Inverter 168 supplies the same clock signal from D flip-flop 166 to the other clock signal generator (e.g. 20) as the reference clock signal for monitoring, and acts as a buffer so that insertion or removal of the other clock signal generator (e.g. 20) does not adversely affect the generation and distribution of the system clock signals by the clock signal generator 10. The 2X CLK and INV CLK signals are used to synchronize and control the operation of the clock monitor 12 and fail over circuit 14 in a manner to be described in more detail below.

If the clock control signal, CONTROL, drops from a logic '1' signal to a logic '0' signal, the J-K flip flop 162 toggles, and a produces a logic '0' at its Q output terminal. This, in turn, disables the oscillator 164. When the oscillator is disabled, all clock signals derived from the oscillator 164 also cease. Generation of the clock control signal, CONTROL, will be described in more detail below.

Figure 5:
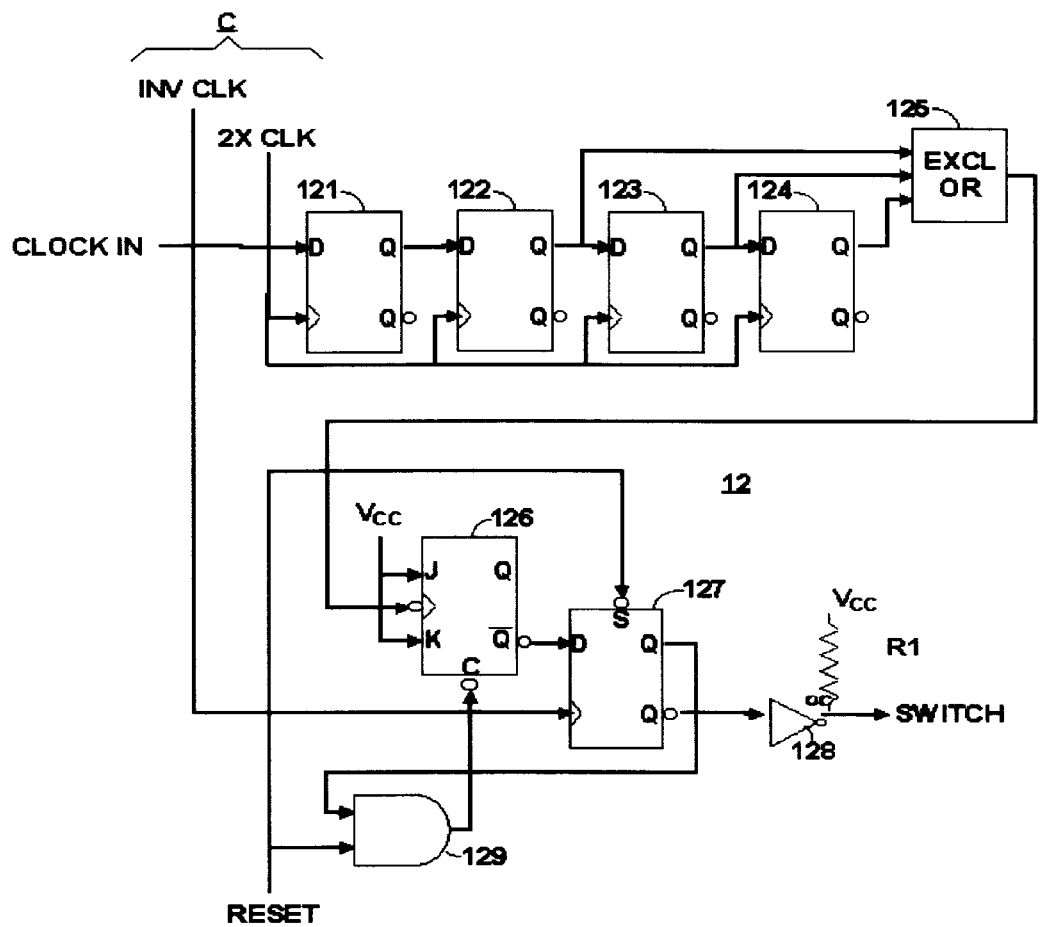
FIG. 5 is a more detailed block diagram of the clock signal monitor circuit illustrated in FIG. 3.

FIG. 5 is a more detailed block diagram of the clock signal monitor circuit 12 illustrated in FIG. 3. In FIG. 5, the reference clock signal from the other clock signal generator (e.g. 20) is monitored to detect a failure. If a failure is detected, a switch signal is generated. In FIG. 5, the reference clock signal at the clock input terminal CLOCK IN is coupled to serially coupled D flip-flops 121, 122, 123 and 124. The clock input terminal CLOCK IN is coupled to the D input terminal of the first D flip-flop 121. The remaining D flip flops 122 through 124 have their D input terminals coupled to the Q output terminals of the preceding D flip-flop. The twice frequency clock signal (2X CLK) from the clock signal generating circuit 16 (of FIGS. 3 and 4), received via the bidirectional control terminal C, is coupled in common to the clock input terminals of all the D flip-flops 121 through 124. The serially coupled D flip-flops 121 through 124, thus, operate as a shift register clocked at twice the clock signal (CLOCK IN) frequency.

The respective Q output terminals of the last three D flip-flops 122, 123 and 124 are coupled to corresponding input terminals of an exclusive-OR network 125, constructed in a known manner. An output terminal of the exclusive-OR network 125 is coupled to a clock signal input terminal of a J-K flip flop 126. The J and K input terminals of the J-K flip-flop 126 are both connected to a source of a $V_{CC}$ operating potential, which is a logic '1' signal. An inverted Q output terminal of the J-K flip-flop 126 is coupled to a D input terminal of a D flip-flop 127. A Q output terminal of the D flip-flop 127 is coupled to a first input terminal of the AND gate 129, and an inverting Q output terminal of the D flip-flop 127 is coupled to an input terminal of an inverting open collector driver 128. An output terminal of the open collector driver 128 is coupled to the switch signal output terminal, SWITCH, and to a source of a $V_{CC}$ operating potential via pull up resister R1. The value of the resistor R1 is preferably selected so that the signal at the switch signal output terminal is held at a logic '1' level if the other clock signal generator (e.g. 20) is removed, and so that the inverting open collector driver 128 can pull the signal at the switch signal output terminal SWITCH to a logic '0' signal if both clock signal generators 10 and 20 are present.

The inverted clock signal INV CLK from the clock generating circuit 16 at the bidirectional control input terminal C is coupled to a clock signal input terminal of the D flip-flop 127. The reset signal RESET is coupled to a preset input terminal S of the D flip-flop 127, and to a second input terminal of the AND gate 129. An output terminal of the AND gate 129 is coupled to the clear signal input terminal of the J-K flip-flop 126.

In operation, the serially coupled D flip-flops 121 through 124, and the exclusive OR network 125 monitor the reference clock signal (CLOCK IN) from the other clock generator (e.g. 20) for proper operation. The first D flip-flop 121 is used to synchronize the phase of the reference clock signal from the other clock signal generator (e.g. 20) to the operation of the shift register formed by the D flip-flops 121 through 124 as clocked by the twice frequency clock signal 2X CLK from this clock signal generator 10. This eliminates metastability which may be present if no such synchronization were performed. The remaining D flip-flops 122 through 124 perform the actual monitoring of the reference clock signal from the other clock signal generator (e.g. 20). Because the shift register is clocked at twice the nominal frequency of the reference clock signal, if the other clock signal generator (e.g. 20) is operating properly the value of at least one of the three signals from the three D flip-flops 122 through 124 should be different from the values of the other two. The exclusive OR network 125 produces a logic '1' signal so long as the value of at least one of the signals at the Q output terminals of the last three D flip-flops 122 through 124 is different from the values of the other two, and produces a logic '0' signal when the values of all three signals are the same, indicating a malfunction of the other clock signal generator 20. Thus, while the other clock signal generator (e.g. 20) is operating properly, the output signal from the exclusive OR network 125 will be a logic '1' signal, and when a malfunction is detected will fall to a logic '0' signal.

The J-K flip-flop 126 is initially reset by the reset signal RESET passing through the AND gate 129 to its clear input terminal C at power up (described in more detail below). Thus, after power up, the output of the inverted Q output terminal of the J-K flip-flop 126 is a logic '1' signal. The J-K flip-flop 126 changes its state when the signal at its clock input terminal falls from a logic '1' signal to a logic '0' signal. When a malfunction in the other clock signal generator 20 is detected, as indicated by the signal at clock input terminal of the J-K flip-flop 126 dropping from a logic '1' signal to a logic '0' signal, as described above, the state of the J-K flip-flop 126 changes, and the signal at the inverted Q output terminal of the flip-flop 126 becomes a logic '0' signal.

The D flip-flop 127 is preset by the reset signal at the preset input terminal S at power up. Thus, after power up the value of the signal at the Q output terminal is a logic '1' signal. This enables the AND gate 129 to pass the reset signal to the clear input terminal of the J-K flip-flop 126, as described above. The D flip-flop 127 is clocked by the inverted clock signal INV CLK. While the reference clock signal from the other clock signal generator (e.g. 20) is operating properly, the logic '1' signal from the inverted Q output terminal of the J-K flip-flop 126 conditions the D flip-flop to produce a logic '0' signal at its inverted Q output terminal. This is inverted by the inverting open collector driver 128, resulting in a logic '1' signal on the switch signal output terminal SWITCH, due to the pull up resistor R1.

When a malfunction of the reference clock signal from the other clock signal generator (e.g. 20) is detected, the signal at the inverted Q output terminal of the J-K flip-flop transitions from a logic '1' signal to a logic '0' signal. At the next cycle of the inverted clock signal INV CLK, this logic '0' signal is clocked into the D flip-flop 127, and the signal at the Q output terminal becomes a logic '0' signal. This disables the AND gate 129, and causes a logic '0' signal to be supplied to the clear input terminal of the J-K flip flop 126. This, in turn forces the J-K flip flop 126 to return to the cleared state in which a logic '1' signal is produced at its inverted Q output terminal.

Simultaneously, the value of the signal at the inverted Q output terminal of the D flip-flop 127 transitions from a logic '0' signal to a logic '1' signal.

The next cycle of the inverted clock signal INV CLK clocks the logic '1' signal at the inverted Q output terminal of the J-K flip-flop 126 (produced in response to the logic '0' signal supplied to the clear input terminal of the J-K flip-flop 126, as described above) through to the Q output terminal of the D flip-flop 127. This reenables the AND gate 129, which supplied a logic '1' signal to the clear input terminal of the J-K flip-flop 126. Simultaneously, the signal at the inverted Q input terminal of the D flip-flop 127 becomes a logic '0' signal again. The inverting open collector driver 128, in turn, produces a logic '1' signal on the switch signal output terminal SWITCH, due to the pull-up resistor R1. In a manner to be described in more detail below, when the other clock signal generator (e.g. 20) receives the logic '0' signal at its switch signal terminal, it immediately ceases to produce clock signals, including the reference clock signal CLOCK IN. The output of the exclusive OR network 125, therefore, remains a logic '0' signal when a malfunction in the reference clock signal CLOCK IN is detected. Thus, when a malfunction is detected in the reference clock signal from the other clock signal generator (e.g. 20) a single pulse having the duration of one inverted clock signal INV CLK period is produced at the switch signal output terminal SWITCH.

Figure 6:
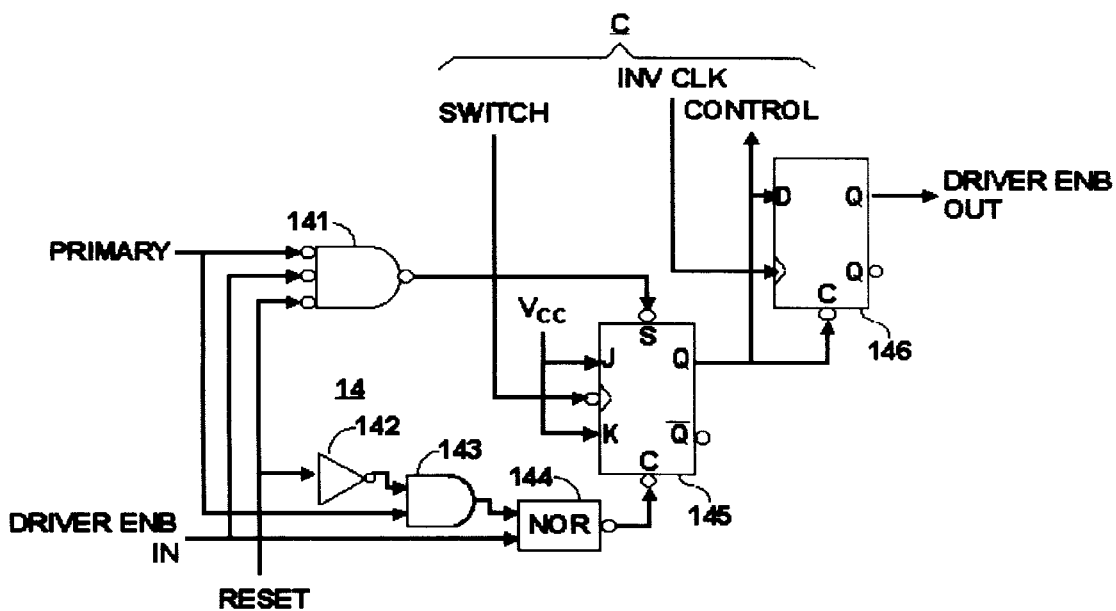
FIG. 6 is a more detailed block diagram of the fail over circuit illustrated in FIG. 3.

FIG. 6 is a more detailed block diagram of the fail over circuit 14 illustrated in FIG. 3. In FIG. 6, the primary input terminal PRIMARY is coupled to a first input terminal of a three input inverted input NAND gate 141 and to a first input terminal of an AND gate 143. The output terminal of the NAND gate 141 is coupled to a preset input terminal S of a J-K flip-flop 145. The driver enable input terminal is coupled to a second input terminal of the NAND gate 141 and to a first input terminal of a NOR gate 144. An output terminal of the NOR gate 144 is coupled to a clear input terminal C of the J-K flip-flop 145. The reset signal input terminal is coupled to a third input of the NAND gate 141, and to an input terminal of an inverter 142. An output terminal of the inverter 142 is coupled to a second input terminal of the AND gate 143. An output terminal of the AND gate 143 is coupled to a second input terminal of the NOR gate 144.

The J and K input terminals of the J-K flip-flop 145 are both coupled to a source of a Vcc operating potential, which is a logic '1' signal. The switch signal SWITCH, received from the clock monitor 12 (of FIGS. 3 and 5) via the control signal terminal C, is coupled to a clock signal input terminal of the J-K flip-flop 145. A Q output terminal of the J-K flip-flop 145 generates a clock control signal, which is coupled to a clear input terminal of a D flip-flop 146, to a D input terminal of the D flip-flop 146, and to the clock control output terminal, CONTROL, which provides this signal to the clock signal generating circuit 16 (of FIGS. 3 and 4) via the control signal terminal C. A Q output terminal of the D flip-flop 146 is coupled to the driver enable output terminal. The inverted clock signal, INV CLK, received from the clock generating circuit 16 (of FIGS. 3 and 4) via the control signal terminal C, is coupled to a clock input terminal of the D flip-flop 146.

In operation, the NAND gate 141, the inverter 142, the AND gate 143 and the NOR gate 144 control the state of the clock signal driver enable output signal of this clock signal generator 10 upon initial application of power, whether this occurs as a part of application of power to the electronic system, or as a part of the insertion of the clock signal generator 10 into an already-powered electronic system. The J-K flip-flop 145 controls the clock signal oscillator (164 of FIG. 4) through the clock control signal, CONTROL, produced at its Q output terminal. Similarly, the D flip-flop 146 supplies the driver enable output signal at its Q output terminal in response to the clock control signal. In general, the initial state of the clock signal drivers of the clock signal generator 10 is determined by the state of the clock signal driver enable input signal from the other clock signal generator (e.g. 20).

In a first initial condition, the NOR gate 144 clears the J-K flip-flop 145 whenever the clock signal driver signal from the other clock signal generator (e.g. 20) is a logic '1' signal, i.e. active, indicating that it is currently supplying clock signals to the clock signal load circuits 31 through 3N (of FIG. 1). When the J-K flip flop 145 is cleared in this manner, the clock control signal, CONTROL, becomes a logic '0' signal. This signal immediately clears the D flip flop 146 (via the clear input terminal), making the clock signal driver enable output signal a logic '0' signal, i.e. inactive. Referring to the clock generating circuit 16 (of FIG. 4), the control signal at the clock signal input terminal of the J-K flip-flop 162 is a logic '0' signal, and the inactive driver enable signal disables the clock signal drivers 169.

If the clock signal driver enable input signal from the other clock signal generator (e.g. 20) is inactive, then the state of this clock signal generator 10 depends on whether this clock signal generator 10 is the primary or secondary clock signal generator.

In another initial condition, the inverting input NAND gate 141 sets the J-K flip-flop 145 when the primary signal is a logic '0' signal, indicating that this clock signal generator 10 is the primary clock signal generator (as described above); the driver enable input signal is a logic '0' signal, indicating that clock signal drivers of the other clock signal generator (e.g. 20) are currently inactive and not supplying clock signals to the clock signal load circuits 31 through 3N (of FIG. 1); and the power on reset signal is a logic '0' signal, indicating that power has just been applied to this clock signal generator 10. (The oscillator 164 (of FIG. 4) is also enabled by the active reset signal, as described above.)

When the J-K flip-flop 145 is set in this manner, the clock control signal, CONTROL, immediately becomes a logic '1' signal. At the next transition of the inverted clock signal INV CLK, the driver enable output signal also becomes a logic '1' signal, i.e. is made active. The active driver enable output signal enables the clock signal drivers 169 in the clock signal generating circuit 16 (of FIG. 4). The active driver enable output signal is also supplied to the other clock signal generator (e.g. 20) as its driver enable input signal.

Referring now to the other clock signal generator (e.g. 20), it is already in the disabled condition, as indicated by its inactive clock signal driver output signal. Its corresponding NOR gate 144, in response to the active (logic '1' signal) driver enable input signal, maintains the corresponding J-K flip flop 145 in a cleared condition, which maintains the logic '0' signal clock control signal at its Q output terminal and the logic '0' driver enable output signal, i.e. an inactive driver enable output signal, and maintains the clock signal drivers in the corresponding clock signal generating circuit 169 in a disabled state.

Thus, a newly powered, or newly inserted primary clock signal generator will enable its clock signal drivers only if the other clock signal generator is not already supplying clock signals to the clock signal load circuits 31 through 3N. This prevents the reinsertion of a previously unpowered primary clock signal generator into an energized electronic system from disrupting the operating secondary clock signal generator. If, on the other hand, the newly powered or newly inserted primary clock signal generator determines that the other clock signal generator is supplying clock signals to the clock signal load circuits 31 through 3N, it will remain disabled, assume the role of a secondary clock signal generator, and monitor the reference clock signal from the other clock signal generator.

In yet another initial condition, the NOR gate 144 clears the J-K flip flop 145 when the primary select signal is a logic '1' signal, indicating that this clock signal generator is the secondary clock signal generator; and the power on reset signal is a logic '0' signal, indicating that power has just been applied to this clock signal generator 10. (The oscillator 164 is also enabled by the reset signal, as described above with reference to FIG. 4.) When the J-K flip flop 145 is cleared in this manner, the clock control signal, CONTROL, becomes a logic '0' signal. This signal immediately clears the D flip flop 146 (via the clear input terminal), making the clock signal driver enable output signal a logic '0' signal, i.e. inactive. Referring to the clock generating circuit 16 (of FIG. 4), the control signal at the clock signal input terminal of the J-K flip-flop 162 is a logic '0' signal, and the J-K flip-flop 162 is set, enabling the oscillator 164. However, the inactive driver enable signal disables the clock signal drivers 169.

A newly powered, or newly inserted secondary clock signal generator (e.g. 20), upon power up, immediately disables its clock signal drivers. Thus, it does not disrupt the functioning primary clock signal generator.

In the clock signal generator which is disabled (e.g. 20), the clock signal monitor 12 (of FIGS. 3 and 5) monitors the reference clock signal from the clock signal generator which is enabled (e.g. 10). If a malfunction is detected, that clock signal monitor 12 generates pulse on the switch signal terminal, SWITCH, as described above. The pulse on the switch signal terminal, SWITCH, is processed by the fail-over circuits 14 in both the clock signal generator which is enabled (e.g. 10), and the clock signal generator which is disabled (e.g. 20).

In the fail-over circuit 14 of the clock signal generator which is enabled (e.g. 10), the flip-flop 145 is in the set state, meaning that the clock control signal, CONTROL, is a logic '1' signal, and the clock signal driver enable output signal is a logic '1' signal. The pulse on the switch signal terminal, SWITCH, causes the J-K flip-flop 145 to toggle. The clock control signal, CONTROL, changes from a logic '1' signal to a logic '0' signal. This immediately clears the D flip-flop 146, and the clock signal driver enable output signal immediately becomes a logic '0' signal, i.e. inactive. Referring now to the clock signal generating circuit 16 (of FIG. 4), the clock signal driver 169 is immediately disabled in response to the logic '0' signal on the clock signal driver enable output signal. Simultaneously, the change of the clock control signal, CONTROL, from a logic '1' signal to a logic '0' signal causes the J-K flip-flop 162, which was in the set state (since the last power-on reset), to toggle. This causes the enable signal to the oscillator 164 to change to a logic '0' signal, and the oscillator 164 is disabled. No further clock signals are produced by the oscillator 164. This effectively completely disables this clock signal generator (e.g. 10). In particular, referring to the clock signal monitor 12 (of FIG. 5) it is impossible for this clock signal monitor to generate any pulses on the switch signal terminal, SWITCH, because neither the twice frequency clock signal, 2X CLK, nor the inverted clock signal INV CLK are being produced. Only when this clock signal generator is removed and then replaced can the clock signal monitor 12 be reactivated.

In the clock signal generator which is disabled (e.g. 20), the flip-flop 145 is in the clear state, meaning that the clock control signal, CONTROL, is a logic '0' signal, and the clock signal driver enable output terminal is a logic '0' signal. The pulse on the switch signal terminal, SWITCH, causes the J-K flip-flop 145 to toggle. The clock control signal, CONTROL, changes from a logic 101 signal to a logic '1' signal. Referring to the clock signal generating circuit 16 (of FIG. 4), the flip-flop 162 was initially set by the reset signal (as described above) and the change in the clock control signal from a logic '0' signal to a logic '1' signal does not induce a change in state. The oscillator 164 remains enabled. Referring again to the fail-over circuit 14 (of FIG. 6), at the next transition of the inverted clock signal, INV CLK, the clock signal driver enable output signal becomes a logic '1' signal, i.e. active. Referring again to the clock signal generating circuit 16 (of FIG. 4), the active clock signal driver enable output signal enables the clock signal drivers 169, and this clock signal generator (e.g. 20) begins to supply clock signals to the clock signal load circuits 31 through 3N (of FIG. 1).

However, the other clock signal generator (e.g. 10) has been completely disabled, i.e. no clock signals are being produced, specifically the reference clock signal is not being produced. Referring to the clock signal monitor 12 (of FIG. 5), because no reference clock signal is being produced, the output signal from the exclusive-OR gate never changes from a logic '0' signal. Thus, the J-K flip-flop 126 is never clocked, and this clock signal generator (e.g. 20) can also never produce a pulse on the switch signal terminal, SWITCH. Thus, this clock signal generator (e.g. 20) remains enabled until the other clock signal generator (e.g. 10) is removed and replaced, or a reset signal is generated manually.

This means that once a switch-over is made from one clock signal generator to the other, there is no switching back again, until the failing clock signal generator is replaced, or a reset signal is generated manually. This prevents a failed clock signal generated from being reenabled.

Figure 7:
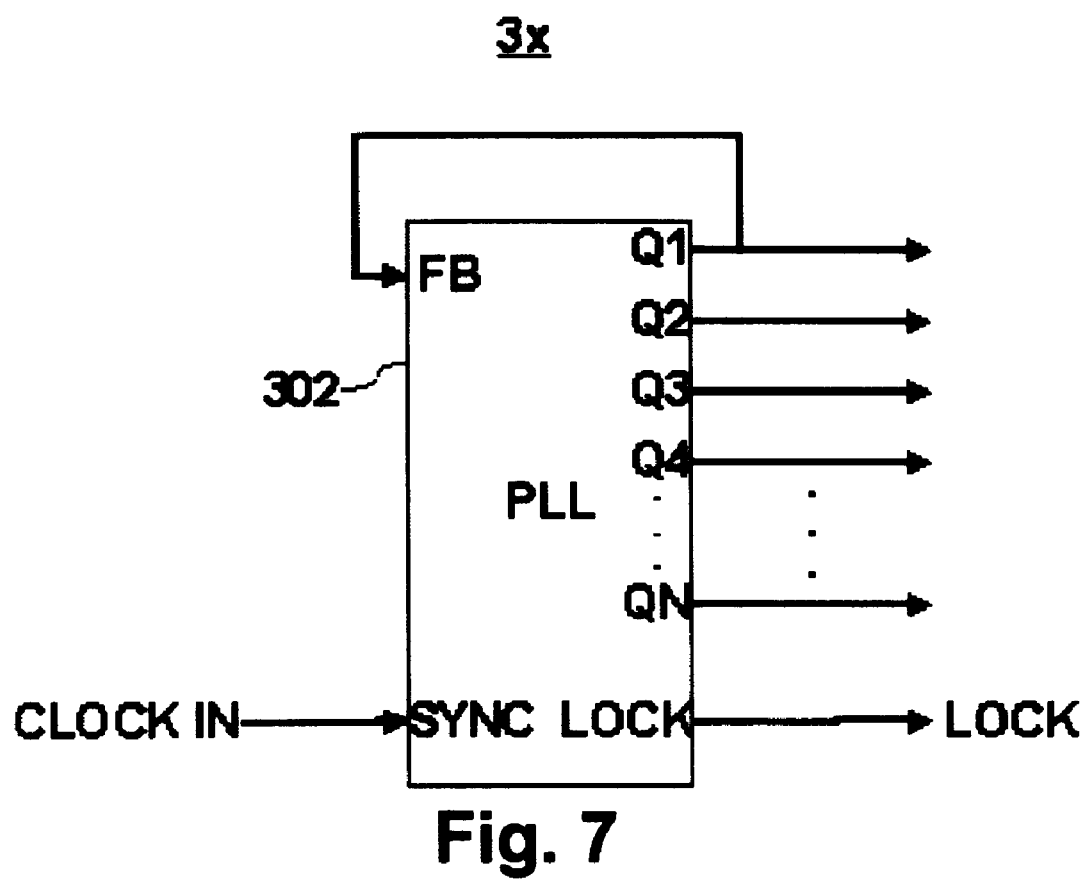
FIG. 7 is a more detailed block diagram of a portion of one of the clock signal load circuits of FIG. 1.

FIG. 7 is a more detailed block diagram of a portion of one of the clock signal load circuits 31 through 3N of FIG. 1, denoted 3x. Although each of the clock signal load circuits 31 through 3N may be different in design, the circuitry illustrated in FIG. 7 is common to all of them. Also, in FIG. 7, only those signals which are relevant to the present invention are illustrated. One skilled in the art will understand that other signals are present, and will understand what those signals are, how to generate them, and provide them to the other circuit elements.

In FIG. 7, a clock signal input terminal, CLOCK IN, is coupled to corresponding output terminals of the first and second clock signal generators 10 and 20 of FIG. 1. The clock signal input terminal CLOCK IN is coupled to a synchronizing signal input terminal of a phase locked loop (PLL) 302. The PLL 302 produces a plurality of clock signals Q1 through QN in a known manner. The plurality of clock signals Q1 through QN are supplied to corresponding clocked circuits (not shown) on the clock signal load circuit 3x. The clock signal Q1 is also coupled to a feedback input terminal FB of the PLL 302. The PLL 302 also includes a lock signal output terminal LOCK.

In operation, a clock input signal is supplied to the clock signal load circuit 3x from one of the clock signal generators 10 or 20 (of FIG. 1) in a manner described in detail above. The PLL 302 operates in a known manner to produce the plurality of clock signals Q1 through QN, synchronized to the clock input signal by comparing the phase of the clock input signal CLOCK IN to that of the signal at the feedback input terminal FB, which, in the illustrated embodiment, is the Q1 clock signal. The PLL 302 also generates the lock signal, also in a known manner, which indicates whether the clock signals Q1 through QN are synchronized to the clock input signal, or not.

In a preferred embodiment, a single PLL 302 provides a single clock signal of a required phase and frequency to each clocked device on the clock signal load circuit 3x. However, if this is not possible, then multiple PLLs may be used without undue impact on clock skew. Also in a preferred embodiment, the signal traces between the PLL 302 and the clocked devices are matched in terms of etch length and impedance. Any effective method of termination may be applied to the clock signal lines Q1 through QN. This will minimize the clock skew amongst the different clocked devices on the clock signal load circuits 31 through 3N.

The use of a PLL on the clock signal load circuit 3x provides protection against runt pulses at the clocked devices during clock source switchovers. As described above, in the event of a clock switchover, the clock input signal should be missing no more than three reference clock signal periods. During the absence of the clock input signal, the frequency of the clock signals Q1 through QN may drift slightly, though the phase relation amongst will remain constant. When the new clock input signal is received from the newly enabled clock signal generator, the frequency of the clock signals Q1 and QN could vary significantly, as the PLL synchronizes to the clock input signal. However, the duty cycle of the clock signals should remain substantially 50%.

There may be clocked components on the clock signal load circuit 3x which are extremely sensitive to changes in frequency and duty cycle. It is possible to use the lock signal from the PLL 302 to control such components. When the clock input signal is initially lost at the time of the clock signal generator switchover, the lock signal will become inactive. It will only become active again when the PLL 302 has synchronized the clock signals Q1 through QN to the new clock input signal. Such sensitive components may be disabled when the lock signal is inactive, and reenabled when the lock signal becomes active again.

It should be noted that the clock distribution system of the present application is illustrated and described above in terms of generic logic blocks, and that any integrated circuit technology may be used to implement this system, such as 5 volt TTL, 3 volt TTL, CMOS, or ECL.

What is claimed is:

1. A clock distribution system, comprising:

a predetermined number greater than one of clock signal load circuits, each having a clock signal input terminal;

a first clock signal generator, having the predetermined number of clock signal output terminals coupled to respective clock signal input terminals of the clock signal load circuits;

a second clock signal generator, having the predetermined number of clock signal output terminals coupled to said respective clock signal input terminals of the clock signal load circuits.

* * * * *